(12) United States Patent
Clevenger et al.

(10) Patent No.: US 6,426,903 B1
(45) Date of Patent: Jul. 30, 2002

(54) REDUNDANCY ARRANGEMENT USING A FOCUSED ION BEAM

(75) Inventors: Lawrence A. Clevenger, LaGrangeville; Louis Lu-Chen Hsu, Fishkill, both of NY (US); Li-Kong Wang, Montvale, NJ (US); Keith Kwong-Hon Wong, Wappingers Falls, NY (US)

(73) Assignee: International Business Machines Corporation, Armonk, CA (US)

( * ) Notice: Subject to any disclaimer, the term of this patent is extended or adjusted under 35 U.S.C. 154(b) by 0 days.

(21) Appl. No.: 09/923,721

(22) Filed: Aug. 7, 2001

(51) Int. Cl.[7] .................................................. G11C 7/00
(52) U.S. Cl. ................ 365/200; 365/185.09; 365/225.7
(58) Field of Search ........................ 365/200, 185.09, 365/225.7

(56) References Cited

U.S. PATENT DOCUMENTS

| | | | | |
|---|---|---|---|---|
| 4,561,906 A | * | 12/1985 | Calder et al. ......... | 148/DIG. 93 |
| 5,519,658 A | * | 5/1996 | Uda et al. ................... | 365/200 |
| 5,741,727 A | * | 4/1998 | Wang ............................. | 438/4 |
| 5,936,297 A | * | 8/1999 | Jun .............................. | 365/96 |
| 6,160,302 A | * | 12/2000 | Palagonia ................... | 257/529 |
| 6,288,437 B1 | * | 9/2001 | Forbes et al. ............... | 257/530 |

* cited by examiner

Primary Examiner—Richard Elms
Assistant Examiner—Tuan T. Nguyen
(74) Attorney, Agent, or Firm—Scully, Scott, Murphy & Presser; Marian Underweiser, Esq.

(57) ABSTRACT

A static redundancy arrangement for a circuit using a focused ion beam anti-fuse methodology which reduces the circuit layout area and the switching activity compared to a prior art dynamic redundancy scheme, resulting in less power, a simpler design and higher speed. Focused ion beam anti-fuse methodology is used to program redundancy for circuits, particularly wide I/O embedded DRAM macros. An anti-fuse array circuit is comprised of a plurality of anti-fuse programming elements, each of which comprises a latch circuit controlled by a set input signal, and an anti-fuse device which is programmed by a focused ion beam.

18 Claims, 3 Drawing Sheets

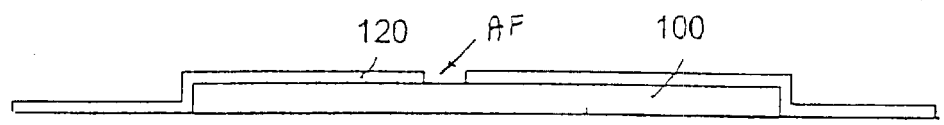
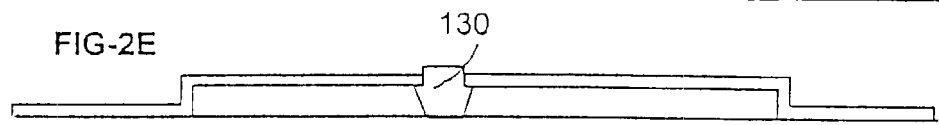
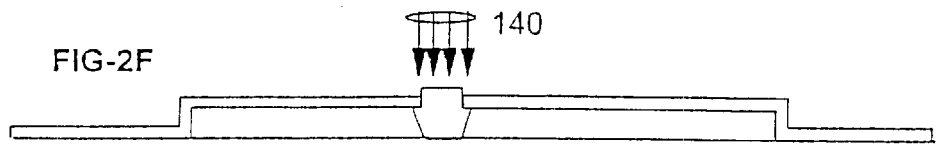
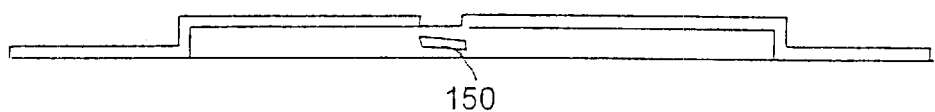
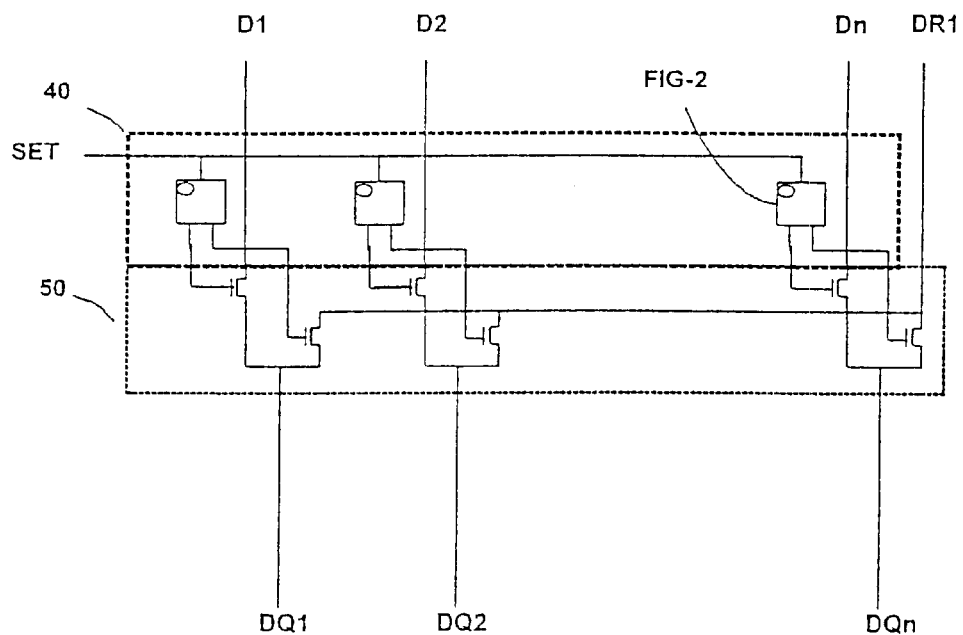

REDUNDANCY ARRANGEMENT USING A FOCUSED ION BEAM

BACKGROUND OF THE INVENTION

1. Field of the Invention

The present invention relates generally to a redundancy arrangement for a circuit using a focused ion beam and more particularly pertains to a static redundancy arrangement for a circuit using a focused ion beam anti-fuse methodology which reduces the circuit layout area compared to a conventional dynamic redundancy arrangement. Furthermore, the static redundancy replacement significantly reduces the switching activity compared to a prior art dynamic redundancy scheme, resulting in less power, a simpler design and higher speed.

2. Discussion of the Prior Art

The semiconductor industry has used focused ion beam writing techniques for many applications, including changing the conductivity of insulating films, depositing dielectric or conductive materials, and trimming of circuits. As reported by M. F. Edinger et al. [Focused Ion Beam Writing Of Electrical Connections Into Platinum Oxide Film, Appl. Phys. Let. (USA) Vol. 76, No. 23, Jun. 5, 2000, P3445–7], a focused Ga +ion beam system has been demonstrated to change the sheet resistance of an insulating platinum oxide film from 4E9 ohm/square into a conducting film with a sheet resistance of 5E2 ohm/square. The large decrease in resistance is caused by an oxygen loss caused by the focused ion beam irradiation. It has been reported that the resolution of the focused ion beam patterning is more than one order of magnitude higher than the resolution of patterning by a laser. In addition, the film quality after ion irradiation is more homogeneous than the film quality after laser irradiation.

The focused ion beam systems are very attractive and versatile tools to make precision modifications in the deep submicron range. For example, using a liquid metal ion source of Ga+ions, the ion beam can be focused down to 5 nm, allowing chemical processes to be confined to nanometer dimensions. The same tool makes it feasible to deposit metals and insulators by sputtering processes, and also to conduct chemical assisted etching and doping in confined areas. The focused ion beam tools have also been used commonly for rapid and flexible chip modification [J. Melingailis, J. Vac Sci. Technol, B5, 469, (1987); T. Tao, W. Wilinkinson, J. Melingailis, J. Vac. Sci. Technol. B9, 162, (1991)].

In focused ion beam metal deposition processes, a stream of precursor gas is directed towards the area of interest where the focused ion beam is writing (the local area is in the mTorr pressure range while the chamber base pressure is in the low 10–7 Torr pressure range). Incident ions of Ga, Cs O2, Ar, N2 etc. break up the gas molecules that are adsorbed onto the surface leading to a metallic deposit. Commonly used metal precursor gases are organometallic or metal halides. Depositions of Au, W, Ta, Al, Pt have been demonstrated. To lower the sheet resistance of the deposits, a post deposition anneal can be carried out.

Focused ion beam deposition of silicon dioxide from tetramethoxysilane and oxygen using a Si ion source has also been reported. Typical beam acceleration voltages and currents are 5 to 50 keV and 0.1 to 2 nA respectively.

Focused ion beam assisted deposition has also been used for circuit modification in integrated circuits [Wang Tai-Ho, U.S. Pat. No. 5,741,727, Circuit Modification And Repair Using A Low Resistance Conducting Metal Bridge And A Focused Ion Beam].

Focused ion beam milling can also be performed with a pure positively charged Ga ion beam, which is usually generated by applying a high electric field between the liquidmetal ion source (Ga) and an ion extractor. The beam energy is typically around 30 to 50 keV and the beam current is typically from 1 to several tens of nA. The beam size resolution can be down to a few nanometers. The beam is programmed to raster across the wafer surface, which is maintained under a high vacuum (around 10–7 mbar).

Nanometer-size GaN/AlGaN device structures fabricated by focused ion beams have also been reported [Kuball, M. Benyoucef, M. Morrissey, F. H. Foxon, "Focused Ion Beam Etching Of Nanometer-Size GaN/AlGaN Device Structures And Their Optical Characterization By Micro-Photoluminescence/Raman Mapping", Materials Research Society Symposium-Proceedings, V595, 2000, Materials Research Society, Warrendale, Pa., USA, p W12.3.1–W12.3.6].

To enhance the etching rate, and to minimize the Ga stain, additional gases can be flowed to the area of interest. For example, xenon difluoride can be used to enhance the etching of silicon dioxide, halogen gases have been used to enhance the etching of aluminum, and water vapor has been used to assist in the removal of carbon-based materials.

However none of the techniques mentioned above have ever been implemented in semiconductor fuse and anti-fuse applications, or used to conduct massive programmability in an automatic manner.

SUMMARY OF THE INVENTION

Accordingly, it is a primary object of the present invention to provide a redundancy arrangement for a circuit using a focused ion beam which is particularly applicable to pitch-limited circuitry, particularly a focused ion beam antifuse approach which provides advantages of a simple design which can be provided in a smaller area as it doesn't require address comparison, column decoding, and a fuse bank, and uses less power by reducing switching activity compared to a prior art dynamic redundancy scheme.

BRIEF DESCRIPTION OF THE DRAWINGS

FIGS. 2D through 2G illustrate a step-by-step anti-fuse programming procedure in which a metal such as Pt is deposited and patterned as a metal wiring.

FIG. 3 illustrates a simplified version of a focused ion beam programmable column redundancy arrangement for an eDRAM macro.

Figure 4:
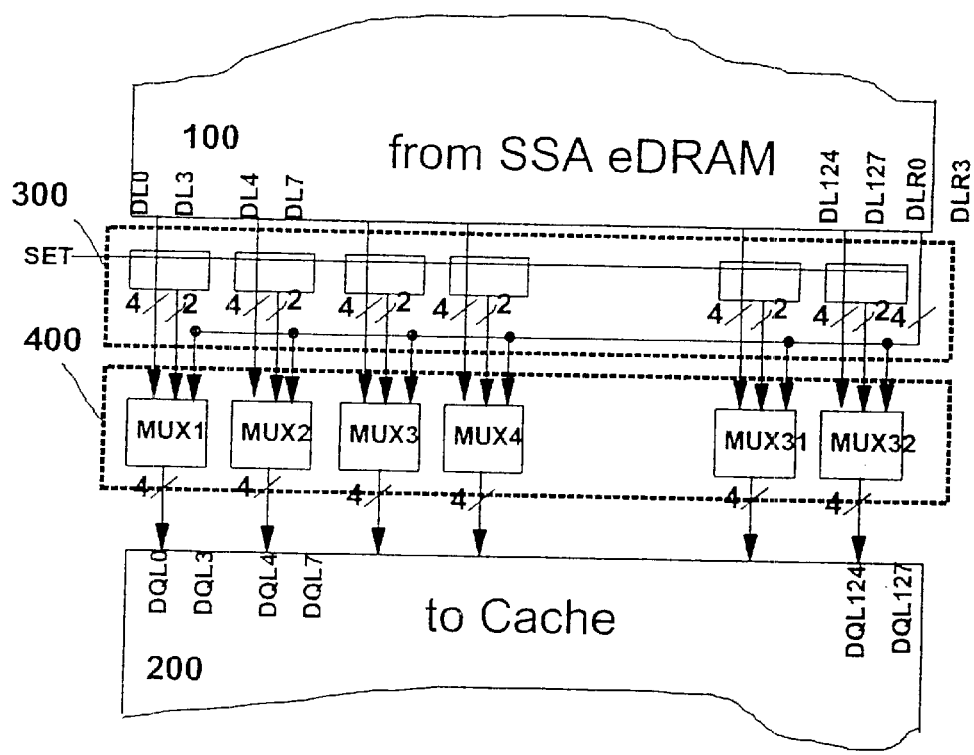
FIG. 4 illustrates an arrangement similar to that of FIG. 1 for an eDRAM macro wherein defective datalines of the macro are repaired pursuant to the present invention by 32 anti-fuse programming elements which are placed in a group above the MUX bank.
Figure 5:
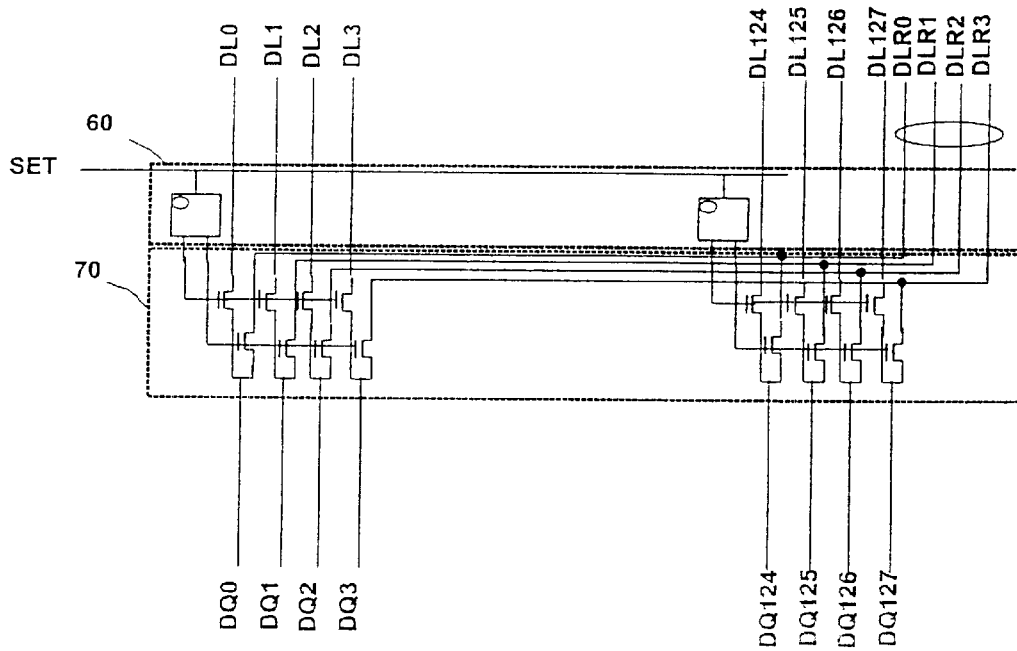

FIG. 5 illustrates the corresponding schematic for FIG. 4 which provides a group of four redundant datalines DLRO to DLR3 which switch or MUX to the corresponding datalines in each group.

DETAILED DESCRIPTION OF THE DRAWINGS

The foregoing objects and advantages of the present invention for a redundancy arrangement using a focused ion beam may be more readily understood by one skilled in the art with reference being had to the following detailed description of several embodiments thereof, taken in conjunction with the accompanying drawings wherein like elements are designated by identical reference numerals throughout the several views, and in which:

Invention disclosure (YOR8-20010030) discloses fuse-like and anti-fuse-like elements and related programming circuitry designed for microelectronic applications. The disclosed technique provides a significant improvement in on-chip programmability especially in very tight pitch-limited circuit layout areas.

The present invention uses focused ion beam anti-fuse methodology to program redundancy for circuits, particularly for wide I/O embedded DRAM macros. In general, eDRAM macros have a large number of data lines, for example in the range of 64 to 256 data lines. It is conceivable that the failure of any one dataline can functionally disable the chip. Therefore, the present invention provides redundant datalines to replace any defective datalines.

In a conventional redundancy replacement approach a large number of control lines are needed in order to select a group of MUX-type switches for redundancy replacement.

Figure 1:
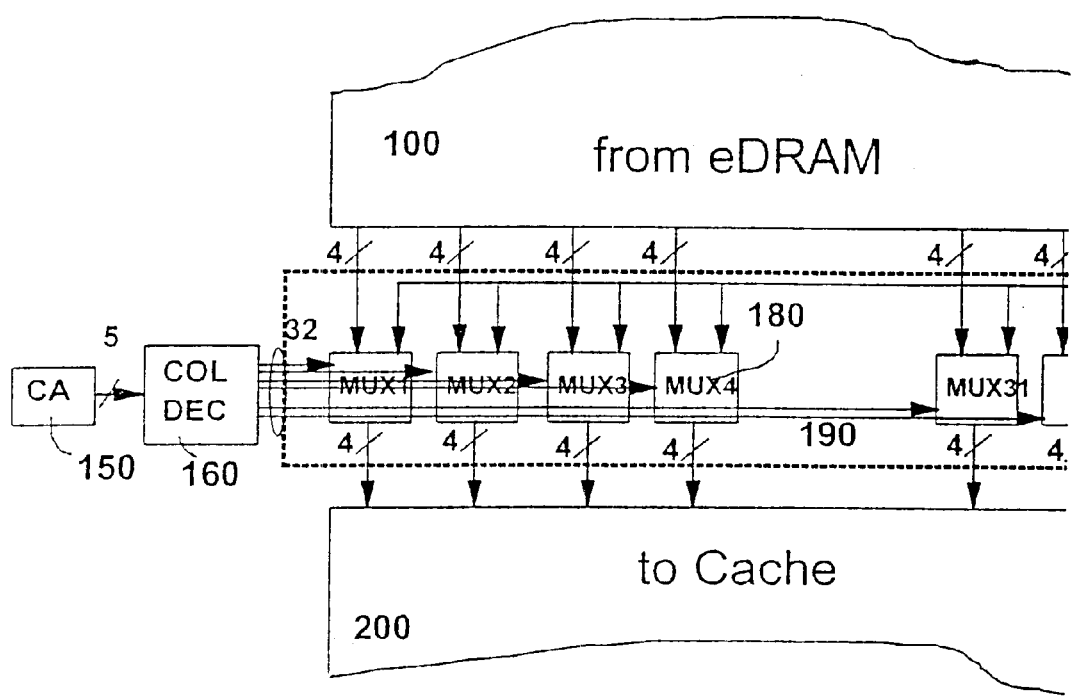
FIG. 1 illustrates an exemplary embodiment of a typical prior art dynamic redundancy replacement or swapping scheme for an embedded eDRAM memory array macro wherein five address bits are needed in order to decode 32 groups of datalines.

FIG. 1 illustrates a typical prior art wide data bus (or I/O) embedded DRAM macro with an eDRAM 100, and an associated cache 200, wherein a plurality of MUX-type switches 180 are provided for redundancy replacement, and are controlled by a column decoder 160. The column decoder is fed with a set of fuse information (or CA) 150 and generates a set of control lines 190.

FIG. 1 illustrates an exemplary embodiment of a prior art dynamic redundancy replacement or swapping scheme for an eDRAM memory array macro wherein five address bits are needed in order to decode 32 groups of datalines. In this case 32 control lines are used to select one of a group of 32 datalines for redundancy replacement. Therefore, a column decoder 160 and other associated circuits 150, 180, 190 are needed to perform dynamic data swapping on the fly. This not only significantly increases the size of the embedded eDRAM macro, but also may cause extra delays during the operation of redundancy replacement. Pursuant to the present invention and as explained in detail hereinbelow, by using a focused ion beam anti-fuse (or fuse) circuit, 32 lines can be eliminated along with the associated decoding and comparison circuits (not shown).

Figure 2A:
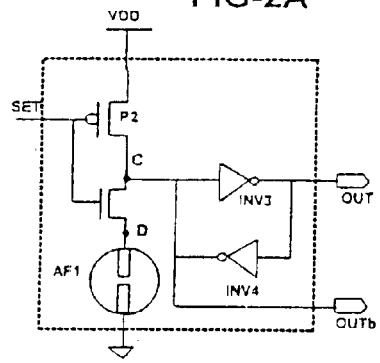
FIG. 2A illustrates in detail an anti-fuse programming element pursuant to the present invention which is comprised of an anti-fuse device and an associated latch circuit.
Figure 2B:
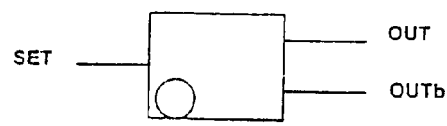
FIG. 2B illustrates more generally the anti-fuse programming element of FIG. 2A.

FIG. 2B illustrates very generally an anti-fuse programming element pursuant to the present invention, and FIG. 2A illustrates the same anti-fuse programming element in greater detail. An anti-fuse array circuit is comprised of a plurality of anti-fuse programming elements as illustrated broadly in FIG. 2B. Each anti-fuse programming element comprises a set or latch circuit controlled by a SET input signal, comprising a pFET and an nFET, and an anti-fuse device AF 1. The anti-fuse device AF1 can be made of a metal oxide such as $PtO_2$, $TiO_2$, etc. which can be programmed by focused ion beam local annealing in a manner as disclosed by Edinger et al. Before programming, the anti-fuse device is opened as shown in FIG. 2A, such that the device AF1 disconnects the internal node D of the set circuit from the ground.

Figure 2C:
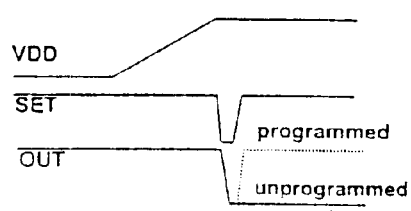
FIG. 2C illustrates waveform diagrams for the circuit of FIG. 2A, wherein the dotted waveform in FIG. 2C(3) illustrates operation in the programmed mode, and the solid waveform in FIG. 2C(3) illustrates operation in the unprogrammed mode.

Therefore before programming, as shown in the waveform diagrams of FIG. 2C (1), (2) and (3), after the chip is powered on and Vdd is established as shown in FIG. 2C (1), a signal SET sets the fuse latch by turning on the pull-up pMOS, or the P2 device, using a short negative pulse. Since the anti-fuse device AF1 is unprogrammed, the voltage on node C remains high and the output voltage is low, as shown by the solid waveform of FIG. 2C (3).

On the other hand, after the anti-fuse device is programmed and the device AF1 is short circuited, the node D of the set circuit is connected to ground. This leads the voltage at node C to ground also, so that the output voltage is high, as shown by the dotted waveform of FIG. 2C(3). One main advantage of focused ion beam antifuses is that the focused ion beam antifuses can be packed in a very high density and are compatible with pitch-limited circuits such as sense amplifiers and datalines. Neither laser fuses nor electrical fuses have such a capability.

FIGS. 2D through 2G illustrate a step-by-step anti-fuse programming procedure in which a metal such as Pt is deposited and patterned as a metal wiring 100. A thin layer of nitride 120 is deposited and then patterned to open and form an anti-fuse area AF. The Pt is oxidized to form $PtO_2$ in the area 130 uncovered by the nitride mask 130. Focused ion beam annealing 140 is then used to drive out the oxygen content in the $PtO_2$ material. After annealing, some residual oxide may still be in the film 150, however the conductivity of the wiring is improved significantly. The focused ion beam antifuse programming is a nondestructive process, and therefore should result in higher yields than conventional fuse or antifuse processes.

FIG. 3 illustrates a simplified version of a focused ion beam programmable column redundancy arrangement pursuant to the present invention. By default, all of the data lines D1, D2 . . . Dn feed through without connecting to the redundant data line. For example, if Dn is the damaged dataline which needs to be replaced by the redundant dataline DR1, then only the last programming element needs to be programmed by the focused ion beam in a manner as illustrated by FIG. 2, wherein FIG. 2 is shown broadly in FIG. 3. This can be done by ion beam irradiation, such as by the process described in detail by Melingailis [J. Melngailis, J. Vac Sci. Technol, B5, 468, (1987)]. After programming, the latch state is changed, allowing redundant dataline DR1 instead of dataline Dn to be connected to output dataline DQn. One or more redundancies can be provided to allow one or more programmings. However, if more defective datalines must be repaired than are provided by the redundancies, then the chip must be discarded.

FIG. 4 illustrates an arrangement similar to that of FIG. 1 for an eDRAM memory array macro wherein defective datalines of this macro are repaired pursuant to the present invention by providing 32 anti-fuse elements, which can be placed in a group 300 above the MUX bank 400. A set control signal activates the fuse latch after power-on. Each anti-fuse element determines whether the datalines pass through the MUX or through the redundant datalines.

For example, in an embodiment wherein a group of 4 datalines are replaced as a group, if DL5 is defective, the focused ion beam programming of the second anti-fuse element allows datalines DL4 to DL7 to be replaced by the redundant lines DLR0 to DLR3. Note that in this example, only one programming is needed for each eDRAM macro to replace a group of 4 datalines.

FIG. 5 illustrates the corresponding schematic for an eDRAM memory array macro as in FIG. 4 which provides a group of four redundant datalines DLR0 to DLR3. These four datalines switch or MUX to the corresponding datalines in each group. As shown, the focused ion beam anti-fuse methodology of the present invention can potentially reduce the circuit layout area compared to a conventional approach. Furthermore, the static redundancy replacement significantly reduces the switching activity compared to a dynamic redundancy scheme, resulting in less power, a simpler design and higher speed.

The present invention has applicability to stand-alone memory devices wherein the stand-alone memory device can compromise one of, a dynamic random access memory (DRAM), static random access memory (SRAM) flash memory, read only memory (ROM), and ferroelectric random access memory (FRAM).

The present invention also has applicability to embedded memory devices wherein the embedded memory device can compromise one of, a dynamic random access memory (DRAM), static random access memory (SRAM), flash memory, read only memory (ROM), and ferroelectric random access memory (FRAM).

While several embodiments and variations of the present invention for a redundancy arrangement using a focused ion beam are described in detail herein, it should be apparent that the disclosure and teachings of the present invention will suggest many alternative designs to those skilled in the art.

Having thus described our invention, what we claim as new and desire to secure by Letters Patent is:

1. A memory circuit having a static redundancy replacement arrangement using a focused ion beam methodology which reduces the circuit layout area, the switching activity and the power consumption relative to a prior art dynamic redundancy scheme, comprising:
    a circuit comprising a plurality of redundant circuit elements to replace faulty circuit elements in the circuit;
    a plurality of focused ion beam-programmable elements, each of which is programmable by using a focused ion beam writing technique to program the programmable element by modifying its conductivity, wherein programming of each programmable element by the focused ion beam replaces a faulty circuit element with a redundant circuit element.

2. The memory circuit of claim 1, wherein the memory is a stand-alone memory device.

3. The memory circuit of claim 2, wherein the stand-alone memory device comprises one of, a dynamic random access memory (DRAM), static random access memory (SRAM), flash memory, read only memory (ROM), and ferroelectric random access memory (FRAM).

4. The memory circuit of claim 1, wherein the memory is an embedded memory device.

5. The memory circuit of claim 4, wherein the embedded memory device comprises one of, a dynamic random access memory (DRAM), static random access memory (SRAM), flash memory, read only memory (ROM), and ferroelectric random access memory (FRAM).

6. The memory circuit of claim 1, wherein each programmable element comprises an anti-fuse programming element.

7. The static redundancy replacement arrangement of claim 6, wherein each anti-fuse element is a metal oxide element which can be programmed by focused ion beam local annealing.

8. The static redundancy replacement arrangement of claim 6, wherein each anti-fuse element is formed and programmed in an anti-fuse programming procedure in which metal is deposited and patterned as a metal conductor, a mask is then deposited and patterned thereover to open and form an anti-fuse area, the metal is oxidized to form a metallic oxide in the area uncovered by the mask, focused ion beam annealing is then used in a programming step to drive out the oxygen content in the metallic oxide material to provide substantial conductivity to the metal conductor.

9. The static redundancy replacement arrangement of claim 1, wherein each programmable element includes a latch circuit, the output of which switches between low and high states depending upon whether the programmable element is programmed or not.

10. The static redundancy replacement arrangement of claim 9, wherein after focused ion beam programming, the state of the latch circuit is changed to connect a redundant dataline instead of a faulty dataline to an output dataline.

11. The static redundancy replacement arrangement of claim 10, wherein a set control signal activates each latch circuit.

12. The static redundancy replacement arrangement of claim 1, including an eDRAM macro having faulty datalines and redundant datalines to replace faulty datalines, wherein defective datalines of the eDRAM macro are repaired by providing a plurality of programmable elements.

13. The static redundancy replacement arrangement of claim 12, wherein the programmable elements comprise anti-fuse elements positioned in an arrayed group above a multiplexer bank in the eDRAM macro.

14. The static redundancy replacement arrangement of claim 1, wherein each programmable element comprises a fuse element which is selectively open-circuited by the focused ion beam.

15. The static redundancy replacement arrangement of claim 1, wherein each programmable element comprises an anti-fuse element which is selectively short-circuited by the focused ion beam.

16. The static redundancy replacement arrangement of claim 1, wherein each programmable element comprises a resistive element which is selectively changed in resistance by the focused ion beam.

17. The static redundancy replacement arrangement of claim 1, for a wide input/output embedded eDRAM macro.

18. The static redundancy replacement arrangement of claim 17, wherein the embedded eDRAM macro has 64 to 256 datalines.

* * * * *

UNITED STATES PATENT AND TRADEMARK OFFICE
CERTIFICATE OF CORRECTION

PATENT NO. : 6,426,903 B1
DATED : July 30, 2002
INVENTOR(S) : Lawrence Clevenger et al.

It is certified that error appears in the above-identified patent and that said Letters Patent is hereby corrected as shown below:

<u>Title page,</u>
Item [73], Assignee, "Armonk, CA" should read -- Armonk, NY --
Item [56], References Cited, U.S PATENT DOCUMENTS, insert the following:
-- 4,924,287　　A　*　　5/1990　Orbach………………..357/02
　　4,990,489　　A　*　　2/1991　Mashiko, et al…………505/1
　　5,844,416　　A　*　　12/1998　Campbell, et al………. 324/750 --
Insert Item -- OTHER PUBLICATIONS, M.F. Edinger, et al. "Focused Ion Beam Writing of Electrical Connections Into Platinum Oxide Film"; Appl. Phys Let (USA) vol 76(23), pgs. 3445-3447, June 5, 2000; J. Melingallis, "Focused Ion Beam Technology and Applications", J. Vac. Sci. Technol., B5, pgs. 469-495, (1987);
T. Tao, et al., "Focused Ion Beam Induced Deposition of Platinum for Repair Processes", J. Vac. Sci Technol., B9, pgs 162-164, (1991);
M. Kuball, et al., "Focused Ion Beam Etching of Nanometer-Size GaN/AIGaN Device Structures and THeir Optical Characterization By Micro-Photoluminescene/Raman Mapping", Materials Research Society Symposium-Proceedings, Materials Research Society, Warrendale, PA, USA, V595, pgs. W12.3.1-W12.4.1, (2000).
Pyle, R.e. Kaushil, et al. "Analytical Study of A Novel and New Failure Mechanism Observed In A High Density CMOS ULSI Device", ASM Int., Abstract;
Rasera, Roy L., et al., "Laser Linking of Metal Interconnect: Linking Dynamics and Failure Analysis", (1969), Abstract;
Bernstein, Joseph B., et al., "Laser Energy Limitation for Buried Metal Cuts" (1998), Abstract;
Platt, J. Butler, et al. "Fault Diagnosis on the TMS320C80 (MVP) Using FasrScan/sup TM/", ASM Int., Abstract- --

UNITED STATES PATENT AND TRADEMARK OFFICE
CERTIFICATE OF CORRECTION

PATENT NO.    : 6,426,903 B1
DATED         : July 30, 2002
INVENTOR(S)   : Lawrence Clevenger et al.

It is certified that error appears in the above-identified patent and that said Letters Patent is hereby corrected as shown below:

<u>Column 1,</u>
Line 21, "As…" should read begin a new paragraph.

Signed and Sealed this

Seventeenth Day of August, 2004

JON W. DUDAS
*Acting Director of the United States Patent and Trademark Office*